(12) United States Patent
Zhamu et al.

(10) Patent No.: US 7,790,285 B2
(45) Date of Patent: Sep. 7, 2010

(54) NANO-SCALED GRAPHENE PLATELETS WITH A HIGH LENGTH-TO-WIDTH ASPECT RATIO

(75) Inventors: Aruna Zhamu, Centerville, OH (US); Jiusheng Guo, Centerville, OH (US); Bor Z. Jang, Centerville, OH (US)

(73) Assignee: Nanotek Instruments, Inc., Dayton, OH (US)

( * ) Notice: Subject to any disclaimer, the term of this patent is extended or adjusted under 35 U.S.C. 154(b) by 193 days.

(21) Appl. No.: 12/002,278

(22) Filed: Dec. 17, 2007

(65) Prior Publication Data

US 2009/0155578 A1 Jun. 18, 2009

(51) Int. Cl.
*B32B 5/16* (2006.01)

(52) U.S. Cl. ........................ 428/402; 977/734; 977/762; 977/773

(58) Field of Classification Search ................. 428/402; 977/773, 734, 762
See application file for complete search history.

(56) References Cited

U.S. PATENT DOCUMENTS

| | | | |
|---|---|---|---|
| 2,798,878 | A | 7/1957 | Hummers |
| 3,434,917 | A | 3/1969 | Kraus et al. |
| 3,885,007 | A | 5/1975 | Olsen et al. |
| 4,091,083 | A | 5/1978 | Hirschvogel et al. |
| 4,244,934 | A | 1/1981 | Kondo et al. |
| 4,350,576 | A | 9/1982 | Watanabe et al. |
| 4,895,713 | A | 1/1990 | Greinke et al. |
| 4,915,925 | A * | 4/1990 | Chung ..................... 423/447.1 |
| 5,186,919 | A * | 2/1993 | Bunnell ....................... 423/448 |
| 5,503,717 | A | 4/1996 | Kang |
| 5,698,088 | A | 12/1997 | Kang |
| 6,287,694 | B1 * | 9/2001 | Zaleski et al. ............... 428/402 |
| 6,406,612 | B1 | 6/2002 | Greinke |
| 6,596,396 | B2 | 7/2003 | Hirata et al. |
| 6,872,330 | B2 * | 3/2005 | Mack et al. .............. 252/378 R |
| 7,071,258 | B1 | 7/2006 | Jang et al. |
| 7,105,108 | B2 * | 9/2006 | Kaschak et al. ......... 252/378 R |
| 7,481,989 | B2 * | 1/2009 | Smalley et al. ............ 423/447.1 |
| 7,550,529 | B2 * | 6/2009 | Drzal et al. .................. 524/495 |
| 7,566,410 | B2 * | 7/2009 | Song et al. ................... 252/511 |
| 7,623,340 | B1 * | 11/2009 | Song et al. ................... 361/502 |
| 7,662,321 | B2 * | 2/2010 | Guo et al. .................... 264/108 |

(Continued)

OTHER PUBLICATIONS

Appenzeller et al, Graphene nanostructures for device applications, 2009.*

(Continued)

*Primary Examiner*—H. (Holly) T Le

(57) ABSTRACT

This invention provides a nano-scaled graphene platelet (NGP) having a thickness no greater than 100 nm and a length-to-width ratio no less than 3 (preferably greater than 10). The NGP with a high length-to-width ratio can be prepared by using a method comprising (a) intercalating a carbon fiber or graphite fiber with an intercalate to form an intercalated fiber; (b) exfoliating the intercalated fiber to obtain an exfoliated fiber comprising graphene sheets or flakes; and (c) separating the graphene sheets or flakes to obtain nano-scaled graphene platelets. The invention also provides a nanocomposite material comprising an NGP with a high length-to-width ratio. Such a nanocomposite can become electrically conductive with a small weight fraction of NGPs. Conductive composites are particularly useful for shielding of sensitive electronic equipment against electromagnetic interference (EMI) or radio frequency interference (RFI), and for electrostatic charge dissipation.

20 Claims, 6 Drawing Sheets

U.S. PATENT DOCUMENTS

2004/0127621 A1* 7/2004 Drzal et al. .................. 524/424
2006/0148965 A1* 7/2006 Drzal et al. .................. 524/496
2006/0241237 A1* 10/2006 Drzal et al. .................. 524/495
2008/0048152 A1* 2/2008 Jang et al. ............... 252/378 R
2008/0258359 A1* 10/2008 Zhamu et al. ............... 264/673
2008/0279756 A1* 11/2008 Zhamu et al. ............... 423/448
2009/0022649 A1* 1/2009 Zhamu et al. ............ 423/415.1
2009/0169467 A1* 7/2009 Zhamu et al. ............... 423/448

OTHER PUBLICATIONS

Shemella et al, Energy gaps in zero-dimensional graphene nanoribbons, Applied Phy Lett. 91, 042101 (2007).*

* cited by examiner

----- 10 μm    FIG. 3(A)
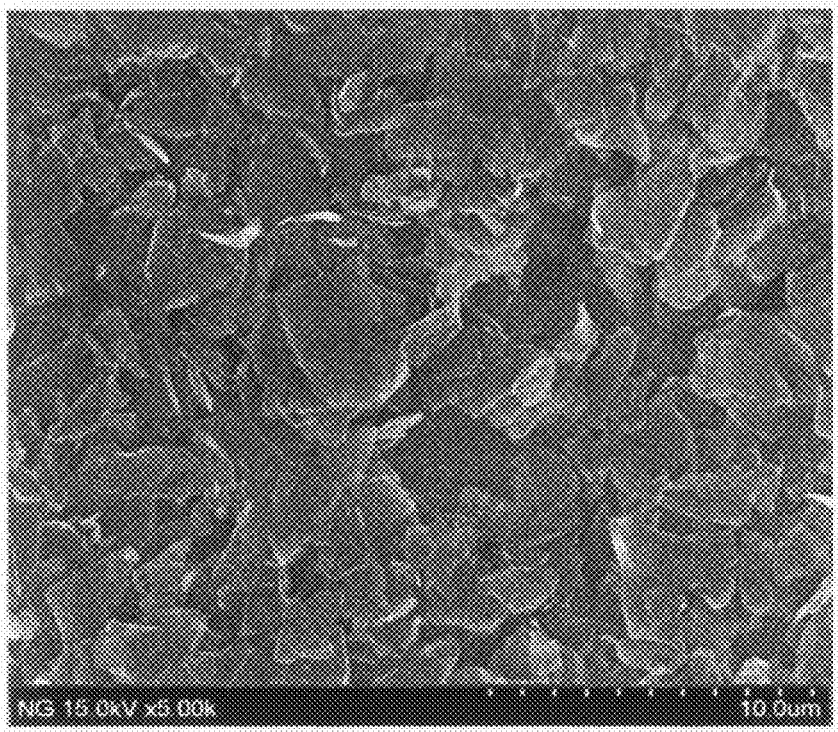
----- 2.5 μm    FIG. 3(B)

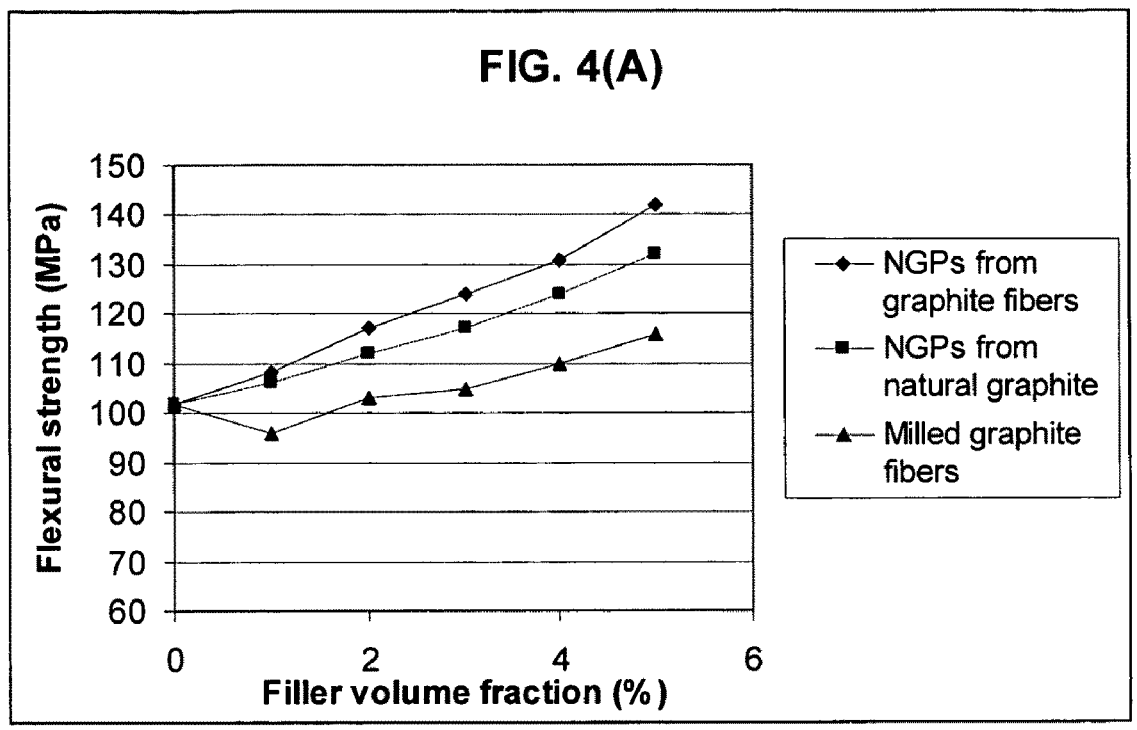

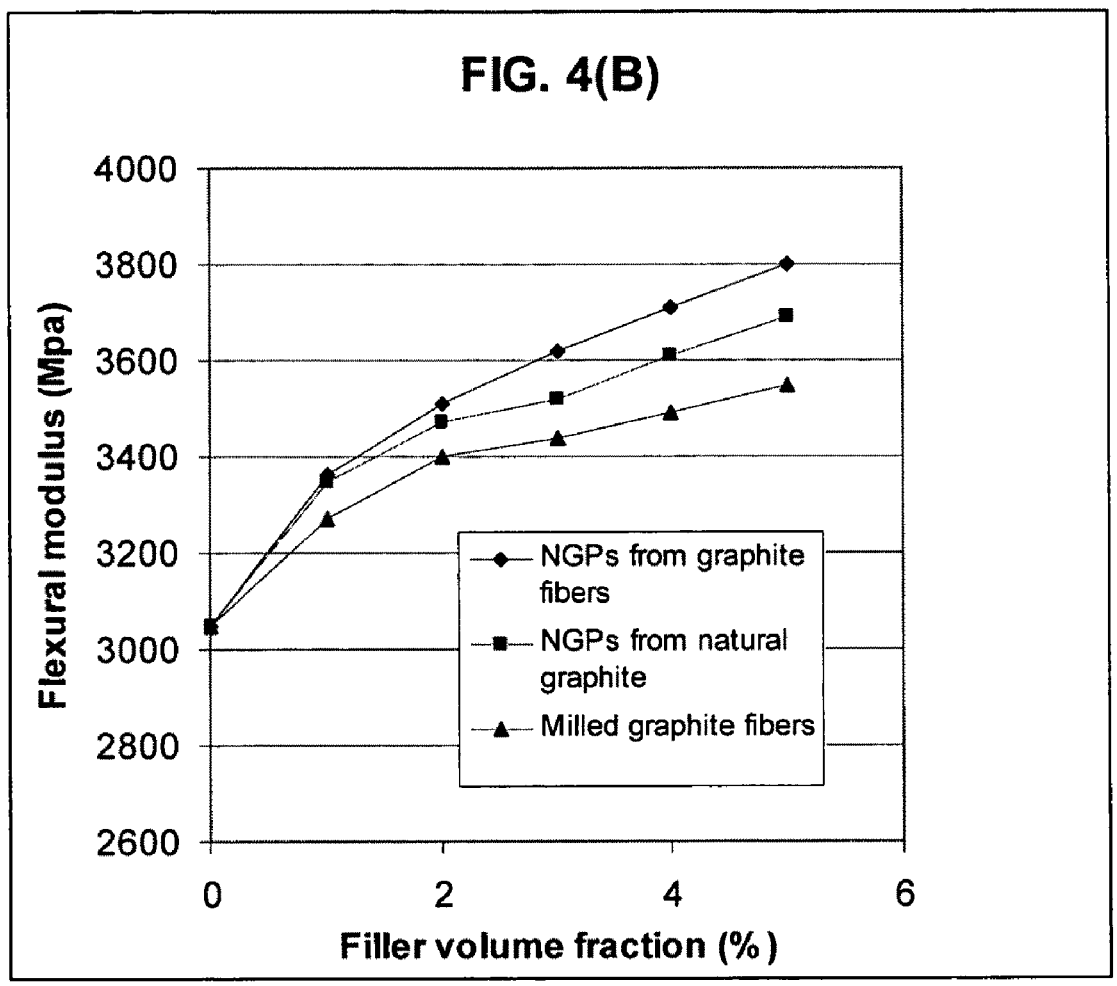

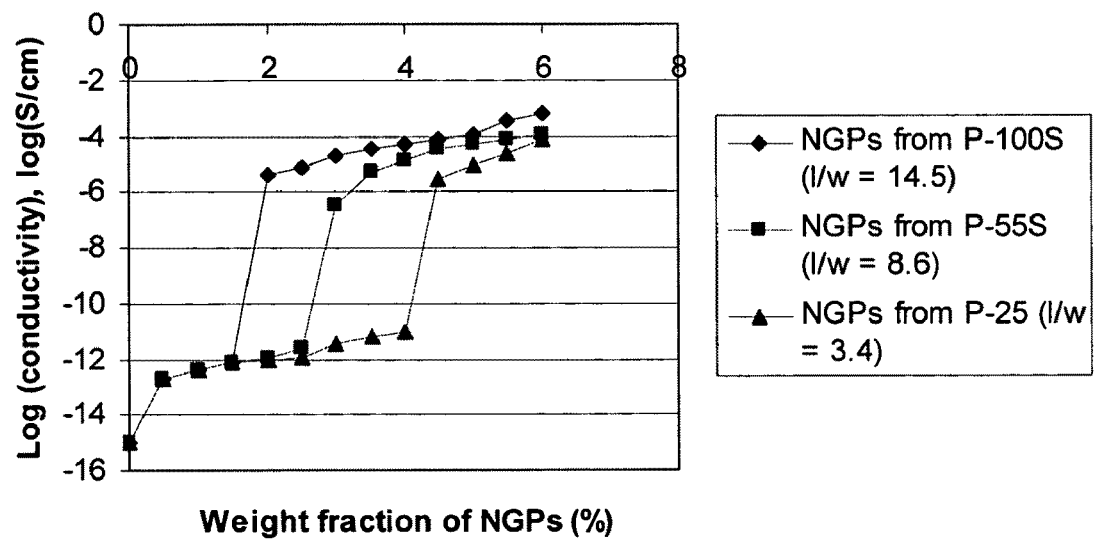

NANO-SCALED GRAPHENE PLATELETS WITH A HIGH LENGTH-TO-WIDTH ASPECT RATIO

This invention is based on the research result of a US Department of Energy (DoE) Small Business Innovation Research (SBIR) project. The US government has certain rights on this invention.

FIELD OF THE INVENTION

The present invention relates to a new type of nano-scaled graphene platelets (NGPs) or graphite nano-platelets that are characterized by having a high in-plane aspect ratio (e.g., with a length/width ratio greater than 3). The invention also provides a nanocomposite comprising such NGPs as a reinforcement dispersed in a matrix material.

BACKGROUND

Carbon is known to have four unique crystalline structures, including diamond, graphite, fullerene, and carbon nano-tubes. The carbon nano-tube (CNT) refers to a tubular structure grown with a single wall or multi-wall, which can be conceptually obtained by rolling up a graphene sheet or several graphene sheets to form a concentric hollow structure. A graphene sheet is composed of carbon atoms occupying a two-dimensional hexagonal lattice. Carbon nano-tubes have a diameter on the order of a few nanometers to a few hundred nanometers. Carbon nano-tubes can function as either a conductor or a semiconductor, depending on the rolled shape and the diameter of the tubes. Its longitudinal, hollow structure imparts unique mechanical, electrical and chemical properties to the material. Carbon nano-tubes are believed to have great potential for use in field emission devices, hydrogen fuel storage, rechargeable battery electrodes, and as composite reinforcements.

However, CNTs are extremely expensive due to the low yield and low production rates commonly associated with all of the current CNT preparation processes. The high material costs have significantly hindered the widespread application of CNTs. Rather than trying to discover much lower-cost processes for nano-tubes, we have worked diligently to develop alternative nano-scaled carbon materials that exhibit comparable properties, but can be produced in larger quantities and at much lower costs. This development work has led to the discovery of processes for producing individual nano-scaled graphite planes (individual graphene sheets) and stacks of multiple nano-scaled graphene sheets, which are collectively called nano-scaled graphene plates (NGPs). NGPs could provide unique opportunities for solid state scientists to study the structures and properties of nano carbon materials. The structures of these materials may be best visualized by making a longitudinal scission on the single-wall or multi-wall of a nano-tube along its tube axis direction and then flattening up the resulting sheet or plate. Studies on the structure-property relationship in isolated NGPs could provide insight into the properties of a fullerene structure or nano-tube. Furthermore, these nano materials could potentially become cost-effective substitutes for carbon nano-tubes or other types of nano-rods for various scientific and engineering applications. The electronic, thermal and mechanical properties of NGP materials are expected to be comparable to those of carbon nano-tubes; but NGP will be available at much lower costs and in larger quantities.

Direct synthesis of the NGP material had not been possible, although the material had been conceptually conceived and theoretically predicted to be capable of exhibiting many novel and useful properties. In a commonly assigned patent, one of the present inventors (Jang) and our colleague (Huang) have provided an indirect synthesis approach for preparing NGPs and related materials [B. Z. Jang and W. C. Huang, "Nano-scaled Graphene Plates," U.S. Pat. No. 7,071,258 (Jul. 4, 2006)]. In most of the prior art methods for making separated graphene platelets, the process begins with intercalating lamellar graphite flake particles with an expandable intercalation agent (also known as an intercalant or intercalate) to form a graphite intercalation compound (GIC), typically using a chemical oxidation [e.g., References 1-5, listed below] or an electrochemical (or electrolytic) method [e.g., Refs.6, 7, 17, 18]. The GIC is characterized as having intercalate species, such as sulfuric acid and nitric acid, residing in interlayer spaces, also referred to as interstitial galleries or interstices. In traditional GICs, the intercalant species may form a complete or partial layer in an interlayer space or gallery. If there always exists one graphene layer between two intercalant layers, the resulting graphite is referred to as a Stage-1 GIC. If n graphene layers exist between two intercalant layers, we have a Stage-n GIC.) This intercalation step is followed by rapidly exposing the GIC to a high temperature, typically between 800 and 1,100° C., to exfoliate the graphite flakes, forming vermicular graphite structures known as graphite worms. Exfoliation is believed to be caused by the interlayer volatile gases, created by the thermal decomposition or phase transition of the intercalate, which induces high gas pressures inside the interstices that push apart neighboring graphene layers or basal planes. In some methods, the exfoliated graphite (worms) is then subjected to air milling, air jet milling, ball milling, or ultrasonication for further flake separation and size reduction. Conventional intercalation and exfoliation methods and recent attempts to produce exfoliated products or separated platelets are discussed in the following representative references:

1. J. W. Kraus, et al., "Preparation of Vermiculite Paper," U.S. Pat. No. 3,434,917 (Mar. 25, 1969).
2. L. C. Olsen, et al., "Process for Expanding Pyrolytic Graphite," U.S. Pat. No. 3,885,007 (May 20, 1975).
3. A. Hirschvogel, et al., "Method for the Production of Graphite-Hydrogensulfate," U.S. Pat. No. 4,091,083 (May 23, 1978).
4. T. Kondo, et al., "Process for Producing Flexible Graphite Product," U.S. Pat. No. 4,244,934 (Jan. 13, 1981).
5. R. A. Greinke, et al., "Intercalation of Graphite," U.S. Pat. No. 4,895,713 (Jan. 23, 1990).
6. F. Kang, "Method of Manufacturing Flexible Graphite," U.S. Pat. No. 5,503,717 (Apr. 2, 1996).
7. F. Kang, "Formic Acid-Graphite Intercalation Compound," U.S. Pat. No. 5,698,088 (Dec. 16, 1997).
8. P. L. Zaleski, et al. "Method for Expanding Lamellar Forms of Graphite and Resultant Product," U.S. Pat. No. 6,287,694 (Sep. 11, 2001).
9. J. J. Mack, et al., "Chemical Manufacture of Nanostructured Materials," U.S. Pat. No. 6,872,330 (Mar. 29, 2005).
10. M. Hirata and S. Horiuchi, "Thin-Film-Like Particles Having Skeleton Constructed by Carbons and Isolated Films," U.S. Pat. No. 6,596,396 (Jul. 22, 2003).
11. Bor Z. Jang, Aruna Zhamu, and Jiusheng Guo, "Process for Producing Nano-scaled Platelets and Nanocomposites," Pending, U.S. patent Ser. No. 11/509,424 (Aug. 25, 2006).

12. Bor Z. Jang, Aruna Zhamu, and Jiusheng Guo, "Mass Production of Nano-scaled Platelets and Products," Pending, U.S. patent Ser. No. 11/526,489 (Sep. 26, 2006).
13. Bor Z. Jang, Aruna Zhamu, and Jiusheng Guo, "Method of Producing Nano-scaled Graphene and Inorganic Platelets and Their Nanocomposites," Pending, U.S. patent Ser. No. 11/709,274 (Feb. 22, 2007).
14. Aruna Zhamu, JinJun Shi, Jiusheng Guo, and Bor Z. Jang, "Low-Temperature Method of Producing Nano-scaled Graphene Platelets and Their Nanocomposites," Pending, U.S. patent Ser. No. 11/787,442 (Apr. 17, 2007).
15. Aruna Zhamu, Jinjun Shi, Jiusheng Guo and Bor Z. Jang, "Method of Producing Exfoliated Graphite, Flexible Graphite, and Nano-Scaled Graphene Plates," Pending, U.S. patent Ser. No. 11/800,728 (May 8, 2007).
16. Aruna Zhamu, Joan Jang, Jinjun Shi, and Bor Z. Jang, "Method of Producing Ultra-thin, Nano-Scaled Graphene Plates," Pending, U.S. patent Ser. No. 11/879,680 (Jul. 19, 2007).
17. N. Watanabe, et al., "Method of Producing a Graphite Intercalation Compound," U.S. Pat. No. 4,350,576 (Sep. 21, 1982).
18. R. A. Greinke, "Expandable Graphite and Method," U.S. Pat. No. 6,406,612 (Jun. 18, 2002).
19. L. T. Drzal, H. Fukushima, B. Rook, and M. Rich, "Continuous Process for Producing Exfoliated Nano-Graphite Platelets," U.S. patent application Ser. No. 11/435,350 (May 16, 2006).
20. L. T. Drzal and H. Fukushima, "Expanded Graphite and Products Produced Therefrom," U.S. patent application Ser. No. 11/363,336 (Feb. 27, 2006); Ser. No. 11/361,255 (Feb. 24, 2006); Ser. No. 10/659,577 (Sep. 10, 2003).

In a nano-scaled graphene platelet (NGP), the largest dimension is defined as the length, the smallest dimension as the thickness, and the third or intermediate dimension as the width. It is possible to have length and width being identical or comparable in size. Prior art methods have successfully provided NGPs with a high length-to-thickness ratio, but with comparable length and width dimensions (length-to-width ratio being close to unity). No prior art method has been focused on the consistent production of NGPs with a high length-to-width ratio (greater than 3, preferably greater than 5, and most preferably greater than 10). In several industrial applications, to be discussed later, it is highly desirable to have NGPs with a high length-to-width ratio, in addition to a high length-to-thickness ratio.

SUMMARY OF THE INVENTION

The present invention provides a nano-scaled graphene platelet having a length, a width, and a thickness, wherein the thickness is no greater than 100 nm and the length-to-width ratio is no less than 3. Preferably the length-to-width ratio is greater than 5 and, more preferably, greater than 10. The thickness of the NGP is preferably thinner than 10 nm and more preferably thinner than 1 nm.

The NGP typically has a length in the range of 1 µm to 20 µm. Using a length of 10 µm and a thickness of 1 nm as an example, we have a length-to-thickness ratio of 10,000. With a thickness of 0.334 nm (single graphene sheet) and a length of 10 µm, the length-to-thickness ratio is approximately 30,000. This is a highly desirable feature when NGPs are used as a reinforcement filler in a structural composite or as a conductive additive in an electrically conductive composite for shielding against electromagnetic interference (EMI) or radio frequency interference (RFI). It is well-known in the art of fiber reinforcements (or in the field of composite materials) that a reinforcement phase with a higher length-to-thickness ratio (a macroscopic ribbon reinforcement) or higher length-to-diameter aspect ratio (a fiber reinforcement) means a more efficient reinforcement with a higher composite strength and stiffness at a given reinforcement volume fraction. A higher aspect ratio also leads to a lower conductive filler percolation threshold, i.e., a lower volume or weight fraction of conductive additives needed to achieve a network of electron-conducting paths. However, the prior art has not taught about how the NGP length-to-width ratio or even length-to-thickness ratio would impact the behaviors of NGPs and the properties of composites containing NGPs. The instant application has demonstrated that certain properties of composites are improved when NGPs of a higher length-to-width ratio are used.

In the prior art work, the NGPs (also referred to as graphite nano-sheets or graphite nano-platelets) tend to have a length and a width being comparable in size and, hence, a length-to-width ratio close to unity. After some intensive research and development efforts, we have come to discover that NGPs with a high length-to-width aspect ratio can be prepared from a carbon fiber or graphite fiber. The production method preferably comprises (a) intercalating a carbon fiber or graphite fiber with an intercalate to form an intercalated fiber; (b) exfoliating the intercalated fiber to obtain an exfoliated fiber comprising graphene sheets or flakes; and (c) separating the graphene sheets or flakes to obtain the nano-scaled graphene platelet.

The step of intercalating may comprise chemical intercalating, electrochemical intercalating, gaseous phase intercalating, liquid phase intercalating, supercritical fluid intercalating, or a combination thereof. The chemical intercalating may comprise exposing the carbon fiber or graphite fiber to a chemical selected from sulfuric acid, sulfonic acid, nitric acid, a carboxylic acid, a metal chloride solution, a metal-halogen compound, halogen liquid or vapor, potassium permanganate, alkali nitrate, alkali perchlorate, an oxidizing agent, or a combination thereof. The carboxylic acid may be selected from the group consisting of aromatic carboxylic acid, aliphatic or cycloaliphatic carboxylic acid, straight chain or branched chain carboxylic acid, saturated and unsaturated monocarboxylic acids, dicarboxylic acids and polycarboxylic acids that have 1-10 carbon atoms, alkyl esters thereof, and combinations thereof.

For an intercalate, the metal-halogen compound or halogen liquid or vapor may comprise a molecule selected from bromine ($Br_2$), iodine ($I_2$), iodine chloride (ICl), iodine bromide (IBr), bromine chloride (BrCl), iodine pentafluoride ($IF_5$), bromine trifluoride ($BrF_3$), chlorine trifluoride ($ClF_3$), phosphorus trichloride ($PCl_3$), phosphorus tetrachloride ($P_2Cl_4$), phosphorus tribromide ($PBr_3$), phosphorus triiodide ($PI_3$), or a combination thereof.

The electrochemical intercalating may comprise using nitric acid, formic acid, or a carboxylic acid as both an electrolyte and an intercalate source. Preferably, the electrochemical intercalating comprises imposing a current, at a current density in the range of 50 to 600 A/m$^2$, to the carbon fiber or graphite fiber which is used as an electrode material.

The step of exfoliating the intercalated fiber may comprise exposing the intercalated fiber to a temperature in the range of 150° C. to 1,100° C. When the step of intercalating comprises using an acid as an intercalate, the step of exfoliating the intercalated fiber typically comprises exposing the intercalated fiber to a temperature in the range of 600° C. to 1,100°

C. When the step of intercalating comprises using a halogen or halogen compound as an intercalate, the step of exfoliating the intercalated fiber typically comprises exposing the intercalated fiber to a temperature in the range of 50° C. to 350° C.

The present invention also provides a nanocomposite material that contains NGPs with a high length-to-width aspect ratio. These nanocomposite exhibit several unique and desirable properties.

BRIEF DESCRIPTION OF THE DRAWINGS

FIG. 3 Scanning electron micrographs of (A) NGPs from a PAN-based graphite fiber and (B) NGPs from natural flake graphite.

FIG. 4 (A) flexural strength and (B) flexural modulus of composite materials containing NGPs from graphite fibers, NGPs from natural graphite, and milled graphite fibers.

FIG. 5 Electrical conductivity (percolation threshold) of nanocomposites containing NGPs of different length-to-width aspect ratios.

DETAILED DESCRIPTION OF PREFERRED EMBODIMENTS

Figure 1:
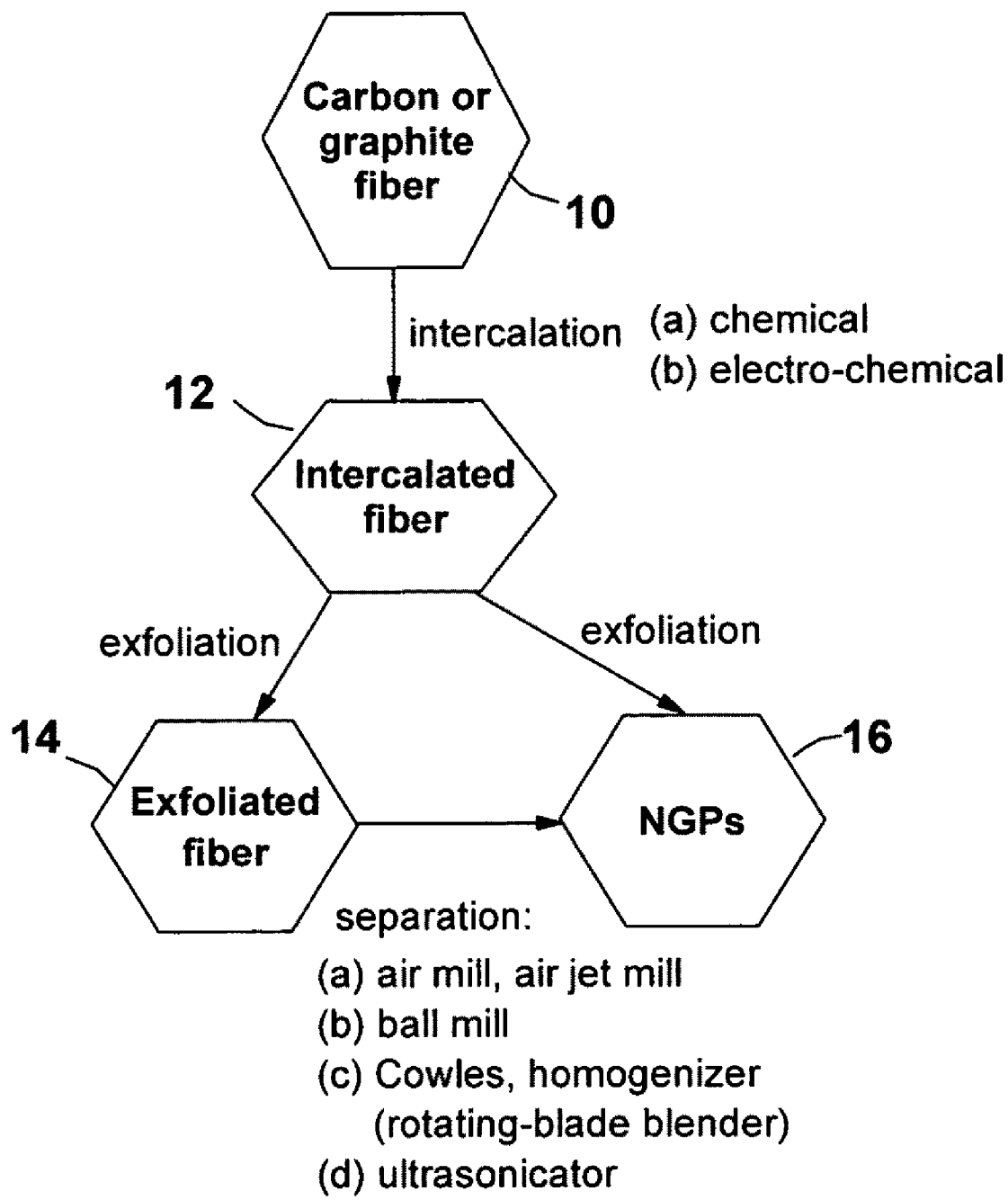
FIG. 1 A flow chart showing a process of producing NGPs with a high length-to-width ratio.

Carbon materials can assume an essentially amorphous structure (glassy carbon), a highly organized crystal (graphite), or a whole range of intermediate structures that are characterized in that various proportions and sizes of graphite crystallites and defects are dispersed in an amorphous matrix. Typically, a graphite crystallite is composed of a number of graphene sheets or basal planes that are bonded together through van der Waals forces in the c-axis direction, the direction perpendicular to the basal plane. These graphite crystallites are typically micron- or nanometer-sized. The graphite crystallites are dispersed in or connected by crystal defects or an amorphous phase in a graphite particle, which can be a graphite flake, carbon/graphite fiber segment, carbon/graphite whisker, or carbon/graphite nano-fiber. In the case of a carbon or graphite fiber segment, the graphene plates may be a part of a characteristic "turbostratic structure."

A carbon or graphite fiber is typically obtained from a precursor, such as polyacrylonitrile (PAN), petroleum or coal tar pitch, or rayon. The production of PAN-based carbon fibers typically involves oxidation of PAN fibers and carbonization of the resulting oxidized fibers at a temperature typically from 350° C. to 2,500° C. Pitch-based carbon fibers are obtained by heat-treating a pitch precursor to form a mesophase or liquid crystalline phase. The procedure is followed by fiber spinning and carbonization. Both PAN- and pitch-based carbon fibers can be further heat-treated or graphitized at a temperature of typically 2,500° C. to 3,000° C. to obtain graphite fibers. Graphite fibers are characterized by having more perfect and larger graphite crystallites, which are better oriented along the fiber axis direction, compared to carbon fibers. In the field of composite materials, many workers do not distinguish the term carbon fiber from graphite fiber.

One preferred embodiment of the present invention is a nano-scaled graphene platelet (NGP) having a high length-to-width ratio (e.g., greater than 3). An NGP is essentially composed of a sheet of graphene plane or multiple sheets of graphene plane stacked and bonded together. Each graphene plane, also referred to as a graphene sheet or basal plane, comprises a two-dimensional hexagonal structure of carbon atoms. Each platelet has a length and a width parallel to the graphite plane and a thickness orthogonal to the graphite plane. In an NGP, the largest dimension is defined as the length, the smallest dimension as the thickness, and the third or intermediate dimension as the width. By definition, the thickness of an NGP is 100 nanometers (nm) or smaller, with a single-sheet NGP being as thin as 0.34 nm. The length and width of a NGP are typically between 1 μm and 20 μm, but could be longer or shorter.

Prior art processes [e.g., Refs.9, 10, 18-20] for the preparation of NGPs typically begin with intercalation of graphite particles (mostly natural flake graphite) to form a graphite intercalation compound (GIC), followed by exfoliation of the GIC. The resulting graphite platelets are typically characterized by having a length and a width being comparable in size. The length-to-width ratio in the prior art graphite platelets was typically less than 2 and, more typically, close to unity. It has not been recognized in the prior art that NGPs with a length-to-width ratio (also herein referred to as in-plane aspect ratio) greater than 3 can be very useful. To the best of our knowledge, no earlier attempt has been made by others to purposely produce NGPs with a high length-to-width ratio. No earlier work has been reported on using carbon or graphite fibers to obtain NGPs with a desired length-to-width ratio. After intensive research work, we have surprisingly discovered that these NGPs with a high in-plane aspect ratio can be advantageously used in many industrial applications.

Referring to FIG. 1, NGPs with a high length-to-width aspect ratio can be obtained by using a method that comprises (a) intercalating a carbon fiber or graphite fiber 10 with an intercalate (intercalating agent) to form an intercalated fiber 12; (b) exfoliating the intercalated fiber to obtain an exfoliated fiber 14 comprising graphene sheets or flakes (some of which may be still somehow bonded to one another); and (c) separating the graphene sheets or flakes to obtain the nano-scaled graphene platelet 16. In some cases, the exfoliation step results in the formation of some NGPs without an additional separation step. Hence, in these latter cases, step (c) is optional.

The step of intercalating may comprise chemical intercalating, electrochemical intercalating, gaseous phase intercalating, liquid phase intercalating, supercritical fluid intercalating, or a combination thereof. The chemical intercalating may comprise exposing the carbon fiber or graphite fiber to an intercalate (intercalating agent or intercalant) selected from sulfuric acid, sulfonic acid, nitric acid, a carboxylic acid, a metal chloride solution, a metal-halogen compound, halogen liquid or vapor, potassium permanganate, alkali nitrate, alkali perchlorate, an oxidizing agent, or a combination thereof. The carboxylic acid may be selected from the group consisting of aromatic carboxylic acid, aliphatic or cycloaliphatic carboxylic acid, straight chain or branched chain carboxylic acid, saturated and unsaturated monocarboxylic acids, dicarboxylic acids and polycarboxylic acids that have 1-10 carbon atoms, alkyl esters thereof, and combinations thereof. Alternatively, the intercalant may comprise an alkali metal (e.g., Li, Na, K, Rb, Cs, or a combination thereof, such as a eutectic).

For an intercalate, the metal-halogen compound or halogen liquid or vapor may comprise a molecule selected from bromine ($Br_2$), iodine ($I_2$), iodine chloride (ICl), iodine bromide (IBr), bromine chloride (BrCl), iodine pentafluoride ($IF_5$), bromine trifluoride ($BrF_3$), chlorine trifluoride ($ClF_3$), phosphorus trichloride ($PCl_3$), phosphorus tetrachloride ($P_2Cl_4$), phosphorus tribromide ($PBr_3$), phosphorus triiodide ($PI_3$), or a combination thereof.

In the case of a chemical oxidation (using an acid as an intercalant, for instance), the method comprises:

(a) forming an acid-intercalated fiber by a chemical oxidation reaction which, as examples, uses a combination of a sulfuric acid and nitric acid, or a combination of carboxylic acid and hydrogen peroxide, as an intercalate source. In these two examples, sulfuric acid or carboxylic acid serves as an intercalate while nitric acid or hydrogen peroxide serves as an oxidizing agent in an intercalant-oxidizer mixture. The carbon or graphite fiber is simply immersed in such a mixture at a desired temperature (typically 20-80° C.) for a length of time sufficient for effecting the chemical oxidation-based intercalation reaction;

(b) rapidly heating the intercalated carbon or graphite fiber to a high temperature for a desired length of time sufficient for producing an exfoliated fiber (e.g., 650° C.-1,100° C. in the cases where a mixture of an acid and an oxidizing agent is used as an intercalate). The carboxylic acid intercalation is preferred as the subsequent exfoliation step in this case does not involve the evolution of undesirable species, such as $NO_x$ and $SO_x$, which are common by-products of exfoliating conventional sulfuric or nitric acid-intercalated graphite compounds; and (c) subjecting the resulting exfoliated fiber to a mechanical shearing treatment (e.g., using a rotating-blade mill, air mill, pressurized gas mill, ball mill, or ultrasonicator) to produce the desired nano-scaled graphene platelet.

The carboxylic acid, containing only C, H, and O atoms, may be selected from the group consisting of aromatic carboxylic acid, aliphatic or cycloaliphatic carboxylic acid, straight chain or branched chain carboxylic acid, saturated and unsaturated monocarboxylic acids, dicarboxylic acids and polycarboxylic acids that have 1-10 carbon atoms, alkyl esters thereof, and combinations thereof. Preferably, the carboxylic acid is selected from the group consisting of saturated aliphatic carboxylic acids of the formula $H(CH_2)_nCOOH$, wherein n is a number of from 0 to 5, including formic, acetic, propionic, butyric, pentanoic, and hexanoic acids, anhydrides thereof, reactive carboxylic acid derivatives thereof, and combinations thereof. In place of the carboxylic acids, the anhydrides or reactive carboxylic acid derivatives such as alkyl esters can also be employed. Representative of alkyl esters are methyl formate and ethyl formate. The most preferred carboxylic acids are formic acid and acetic acid.

Representative of dicarboxylic acids are aliphatic dicarboxylic acids having 2-12 carbon atoms, in particular oxalic acid, fumaric acid, malonic acid, maleic acid, succinic acid, glutaric acid, adipic acid, 1,5-pentanedicarboxylic acid, 1,6-hexanedicarboxylic acid, 1,10-decanedicarboxylic acid, cyclohexane-1,4-dicarboxylic acid and aromatic dicarboxylic acids such as phthalic acid or terephthalic acid. Representative of alkyl esters are dimethyl oxylate and diethyl oxylate. Representative of cycloaliphatic acids is cyclohexane carboxylic acid and of aromatic carboxylic acids are benzoic acid, naphthoic acid, anthranilic acid, p-aminobenzoic acid, salicylic acid, o-, m- and p-tolyl acids, methoxy and ethoxybenzoic acids, acetoacetamidobenzoic acids and, acetamidobenzoic acids, phenylacetic acid and naphthoic acids. Representative of hydroxy aromatic acids are hydroxybenzoic acid, 3-hydroxy-1-naphthoic acid, 3-hydroxy-2-naphthoic acid, 4-hydroxy-2-naphthoic acid, 5-hydroxy-1-naphthoic acid, 5-hydroxy-2-naphthoic acid, 6-hydroxy-2-naphthoic acid and 7-hydroxy-2-naphthoic acid. Among the polycarboxylic acids, citric acid is preferred due to its availability and low cost.

Carboxylic acids can be intercalated into carbon fibers both chemically and electrochemically. The carboxylic acid-intercalated carbon or graphite fiber can be easily exfoliated by rapidly heating the intercalated fiber a desired exfoliation temperature. An advantage of such a carboxylic acid-intercalated fiber in comparison with sulfuric acid-intercalated material is that only H, C and O are released into the atmosphere during the exfoliation process. Depending on the applied current density (in the case of electrochemical intercalation) and the reaction time, an expansion volume of from 100-200 ml/g, at 400-800° C., and volatile content of 10-20 wt %, could be obtained. The residual sulfur content in the expanded graphite is no more than the sulfur impurity level of the original graphite flakes since the process is totally sulfur free, as opposed to more than 1,000 ppm of sulfur typically found in conventional exfoliated graphite manufactured from a sulfuric acid-intercalated GIC. Furthermore, the exfoliated fiber and subsequent NGPs do not contain additional corrosive species such as chlorine, fluorine, nitrogen, and phosphor.

The mechanical shearing treatment, used to further separate graphite platelets or flakes of the exfoliated fiber and possibly reduce the flake size, preferably comprises using air milling (including air jet milling), ball milling, mechanical shearing (including rotating blade fluid grinding), any fluid energy based size-reduction process, ultrasonication, or a combination thereof.

In the case of electrochemical intercalation, the desired NGPs with a high length-to-width ratio may be obtained by a method comprising: (a) forming an acid-intercalated carbon or graphite fiber by an electrochemical reaction which uses an acid (e.g., formic acid, nitric acid, or a carboxylic acid) as both an electrolyte and an intercalate source, the carbon or graphite fiber as an anode material, and a metal or graphite as a cathode material, and wherein a current is imposed upon the cathode and the anode at a current density for a duration of time sufficient for effecting the electrochemical reaction; (b) exposing the intercalated carbon or graphite fiber to a thermal shock to produce exfoliated fiber; and (c) subjecting the exfoliated fiber to a mechanical shearing treatment to produce the nano-scaled graphene platelets. The exfoliation step preferably comprises heating the intercalated graphite to a temperature in the range of 300-1,100° C. for a duration of 10 seconds to 2 minutes, most preferably at a temperature in the range of 400-600° C. for a duration of 30-60 seconds.

Figure 2:
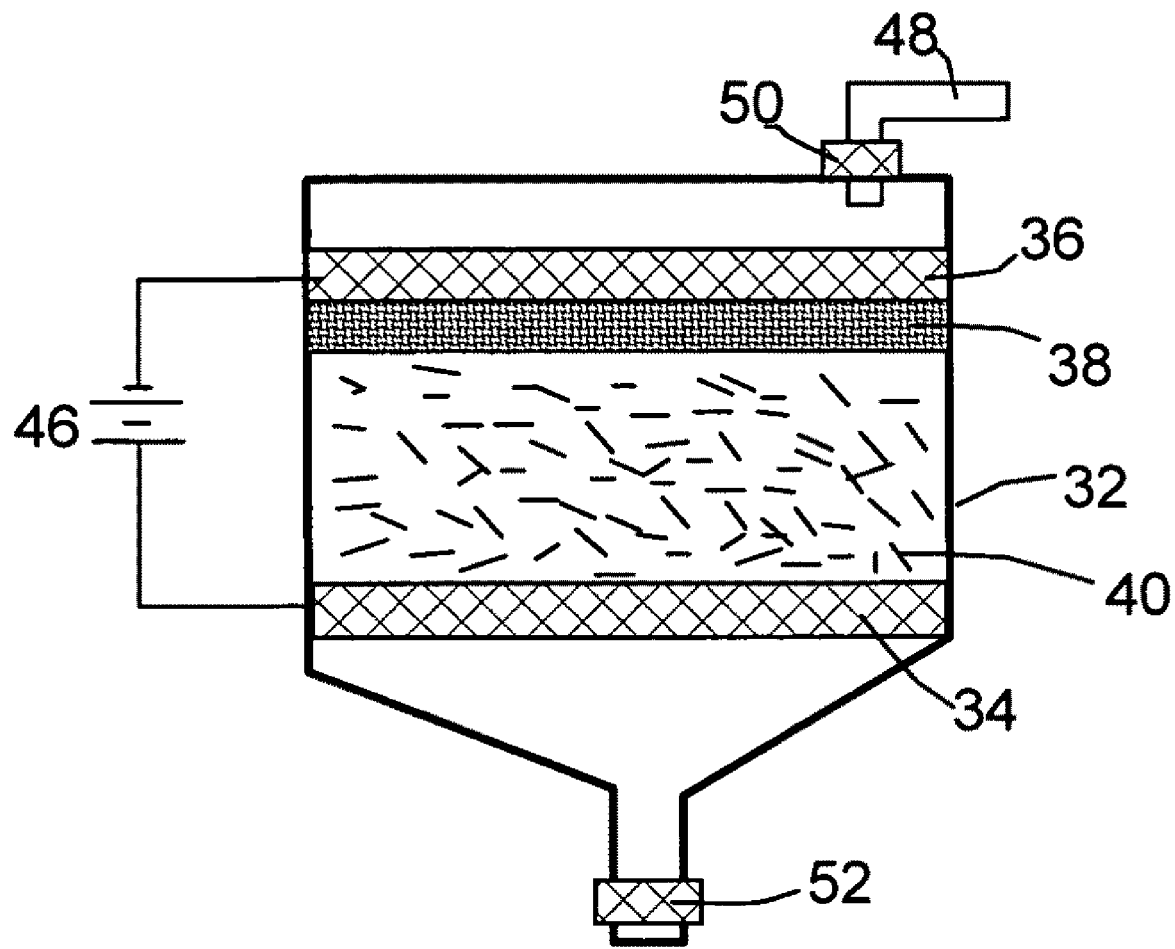
FIG. 2 Schematic of an apparatus for electrochemical intercalation of carbon or graphite fibers.

Schematically shown in FIG. 2 is an apparatus that can be used for electrochemical intercalation of a carbon or graphite fiber material according to a preferred embodiment of the present invention. The apparatus comprises a container 32 to accommodate electrodes and electrolyte. The anode is comprised of multiple carbon or graphite fiber segments 40 that are dispersed in an electrolyte (e.g., a carboxylic acid, which is also an intercalate) and are supported by a porous anode supporting element 34, preferably a porous metal plate, such as platinum or lead. The carbon or graphite fiber segments 40 preferably form a continuous electron path with respect to the anode support plate 34, but are accessible to the intercalate. An electrically insulating, porous separator plate 38 (e.g., Teflon fabric or glass fiber mat) is placed between the anode and the cathode 36 (e.g., a porous graphite or metal plate) to prevent internal short-circuiting. A DC current source 46 is used to provide a current to the anode support element 34 and the cathode 36. The imposing current used in the electrochemical reaction preferably provides a current density in the range of 50 to 600 A/m², most preferably in the range of 100 to 400 A/m². Fresh electrolyte (intercalate) may be supplied from an electrolyte source (not shown) through a pipe 48 and a control valve 50. Excess electrolyte may be drained through a valve 52. In a possible arrangement, the carbon or graphite fiber segments 40 may be long or continuous-length fiber yarns that are used as an anode directly connected to a DC current source.

It may be noted that, in a traditional GIC obtained by intercalation of a laminar graphite material, the intercalant species may form a complete or partial layer in an inter-layer space or gallery. If there always exists one graphene layer between two intercalant layers, the resulting graphite is referred to as a Stage-1 GIC. If n graphene layers exist between two intercalant layers, we have a Stage-n GIC. Carboxylic acid-intercalated graphite compounds were found to be stage-2, stage-3, stage-4, or stage-5, depending on the type of carboxylic acid used. Sulfuric acid-intercalated carbon or graphite fibers can form a stage-1 GIC. Copper and iron chloride solution may also be used to obtain intercalated carbon or graphite fibers comprising stage-1 crystallites. It is generally believed that a necessary condition for the formation of all single-sheet NGPs is to have a perfect Stage-1 GIC for exfoliation. Even with a Stage-1 GIC, not all of the graphene layers get exfoliated for reasons that remain unclear. Similarly, exfoliation of a Stage-n GIC (with n>5) tends to lead to a wide distribution of NGP thicknesses (mostly much greater than n layers). In other words, exfoliation of Stage-5 GICs often yields NGPs much thicker than 10 or 20 layers. Hence, a major challenge is to be able to consistently produce NGPs with well-controlled dimensions (preferably ultra-thin) from acid-intercalated graphite.

Quite surprisingly, the majority of NGPs obtained from carbon or graphite fibers are very thin, mostly much thinner than 2 or 3 nm and many are single graphene sheets or contain only 2-5 graphene sheets. Further, the NGPs produced from carbon or graphite fibers typically have a length-to-width aspect ratio greater than 3, mostly greater than 10, and, in many cases, greater than 20. The NGPs with multiple graphene sheets can be converted into single or double graphene sheets through another cycle of intercalation and exfoliation.

Carbon or graphite fibers can also be intercalated with an alkali metal. For instance, the fiber sample may be heated to 200° C. in an evacuated tube in the presence of potassium to form an intercalated fiber that contains stage-1 intercalation compound. The intercalated fiber is then brought in contact with a liquid, such as methanol, ethanol, a hydroxylic solvent, or a solvent containing water. Rapid exfoliation of the fiber can occur in ethanol, creating thin NGPs which are often naturally separated in ethanol without a need for a subsequent mechanical shearing treatment.

More specifically, a carbon or graphite fiber can be intercalated with alkali (Li, Na, K, Rb, Cs), alkaline earth (Ca, Ba, Sr), or lanthanide metals (Eu, Yb, Sm, Tm) by five different methods: (1) The larger alkali metals (K, Rb, Cs) intercalate the fiber readily by heating at 200° C. Lithium can be intercalated into a carbon fiber, but only at higher temperatures and/or pressures. Sodium intercalation is difficult, but can be accomplished using high reaction temperatures (500-600° C.) for 2 or 3 weeks. Intercalation using the alkaline earth (Ca, Ba, Sr) or lanthanide metals (Eu, Yb, Sm, Tm) also requires high temperatures and long reaction times (similar to lithium intercalation); (2) The carbon or graphite fiber can be intercalated electrochemically using a non-aqueous solvent; (3) An alkali plus naphthalene or benzophenone can be used with a suitable non-aqueous solvent (usually an ether such as tetrahydrofuran); (4) Any of the above mentioned metals (except Li and Na) can be intercalated by dissolving in a liquid ammonia solution to create solvated electrons; and (5). Lithium can be intercalated into a carbon or graphite fiber by using n-butyl lithium in a hydrocarbon solvent (e.g., hexane).

The following examples serve to provide the best modes of practice for the present invention and should not be construed as limiting the scope of the invention:

EXAMPLE 1

NGPs from PAN-Based Graphite Fibers

Continuous graphite fiber yarns (Magnamite from Hercules) were cut into segments of 5 mm long and then ball-milled for 24 hours. Approximately 20 grams of these milled fibers were immersed in a mixture of 2 L of formic acid and 0.1 L of hydrogen peroxide at 45° C. for 24 hours. Following the chemical oxidation intercalation treatment, the resulting intercalated fibers were washed with water and dried. The resulting product is a formic acid-intercalated graphite fiber material.

Subsequently, approximately ½ of the intercalated fiber sample was transferred to a furnace pre-set at a temperature of 600° C. for 30 seconds. The compound was found to induce extremely rapid and high expansions of graphite crystallites. Further separation of exfoliated flakes using a Cowles shearing device led to the formation of NGPs. The thickness of individual platelets was found to range from two graphene sheets to approximately 25 graphene sheets (average of 14 sheets or approximately 4.7 nm) based on SEM and TEM observations. The length of these NGPs was typically in the range of 10-60 μm and width in the range of 0.5-2 μm (e.g., FIG. 3(A)). The length-to-width aspect ratio was typically in the range of 15 to 30.

Approximately one quarter of these NGPs were then subjected to re-intercalation under comparable chemical oxidation conditions to obtain re-intercalated NGPs. Subsequently, these re-intercalated NGPs were transferred to a furnace pre-set at a temperature of 600° C. for 30 seconds to produce ultra-thin NGPs. Electron microscopic examinations of selected samples indicated that the majority of the resulting NGPs contained between single graphene sheet (approximately 0.34 nm) and five sheets (approximately 1.7 nm). The length-to-thickness ratio was between 10,000 and 100,000.

COMPARATIVE EXAMPLE 1a

NGPs from Natural Flake Graphite

Natural flake graphite of approximately 20 μm in size was subjected to comparable intercalation, exfoliation, and separation treatment. The resulting NGPs have a length-to-width aspect ratio of 1-2 (FIG. 3(B)). A comparison between the SEM micrograph of FIG. 3(A) and that of FIG. 3(B) demonstrates vastly distinct morphologies between the NGPs obtained from graphite fibers and NGPs from natural flake graphite.

COMPARATIVE EXAMPLE 1b

Milled Graphite Fibers and Composites

Another batch of milled graphite fibers was prepared in a similar manner as that of Example 1, but without the subsequent intercalation and exfoliation steps. Various volume fractions of milled graphite fibers were mixed with an epoxy resin (Epon 828 from Shell Chemical Co.) and curing agent (Jeffamine T403 from Huntsman Chemicals) to obtain a series of chopped fiber reinforced composite materials, herein referred to as Composite Sample 1b.

A second series of composite samples (Composite Sample 1) were similarly prepared from the NGPs with a high length-to-width ratio prepared in Example 1. A third series of composites (Composite Sample 1a) were similarly prepared from the NGPs of low length-to-width aspect ratio prepared in Comparative Sample 1a. Three-point bending type flexural tests were then conducted on the three series of composites. The flexural strength and flexural modulus data of these three series are shown in FIG. 4(A) and FIG. 4(B), respectively.

Several significant observations can be made from these two figures: The NGPs with a higher length-to-width ratio appear to be a more effective composite reinforcement compared with NGPs with a lower length-to-width ratio in terms of both flexural strength and modulus of the resulting composites. This is a very surprising result and the reasons for this difference remain unclear. We could only speculate that a higher length-to-width ratio can enable NGPs to be better aligned in a preferred orientation. Both types of NGPs provide a more efficient reinforcing effect to the mechanical properties of a matrix resin. It is of interest to note that by extracting the constituent graphene sheets from the graphite crystallites embedded in a graphite fiber (that otherwise contains many defects and non-crystalline zones) one obtains NGPs that are essentially single crystals, which have superior mechanical, electrical, and thermal properties compared with their defect-laden parent fiber.

EXAMPLE 2

NGPs from Sulfuric/Nitric Acid-Intercalated Pitch-Based Carbon Fibers and Nanocomposites Containing Such NGPs Fifty grams each of a series of carbon and graphite fibers from Amoco (P-25, P-30X, P-55S, P-75S, P-100S, and P-120S) were intercalated with a mixture of sulfuric acid, nitric acid, and potassium permanganate at a weight ratio of 4:1:0.05 (graphite-to-intercalate ratio of 1:3) for four hours. Upon completion of the intercalation reaction, the mixture was poured into deionized water and filtered. The sample was then washed with 5% HCl solution to remove most of the sulfate ions and residual salt and then repeatedly rinsed with deionized water until the pH of the filtrate was approximately 5. The dried sample was then exfoliated at 1,050° C. for 45 seconds. These samples were separately submitted to a mechanical shearing treatment in a Cowles (a rotating-blade dissolver/disperser) for 10 minutes. The resulting NGPs were examined using SEM and TEM and their length, width, and thickness were measured. The average length-to-width ratios of the resulting NGPs from P-25, P-30X, P-55S, P-75S, P-100S, and P-120S were found to be approximately 3.4, 5.3, 8.6, 9.6, 14.5, and 15.4, respectively.

NGPs obtained from P-25, P-55S, and P-100S were separately mixed with an epoxy resin to obtain nanocomposite samples of various NGP weight fractions. The electrical conductivity values of the nanocomposite samples were measured and plotted as a function of the NGP weight fraction. FIG. 5 shows that, with a higher length-to-width ratio, NGPs in a polymer matrix reaches a percolation conductivity state (forming a network of electron-conducting paths) at a lower threshold weight fraction. In other words, one would need a smaller amount of NGPs to make a resin composite electrically conductive if the NGPs have a larger length-to-width ratio. Conductive nanocomposites can be used in applications, such as EMI/RFI shielding and electrostatic charge dissipation.

Although a resin is herein used as an example, the matrix material for making a nanocomposite is not limited to a polymer (thermoplastic, thermoset, rubber, etc.). The matrix can be a glass, ceramic, carbon, metal, or other organic material, provided the matrix material can be mixed with NGPs via melt mixing, solution mixing, vapor infiltration, solid state sintering, etc. The weight fraction of such a nanocomposite can be between 0.1% and 99%.

EXAMPLE 3

NGPs from Electrochemical Intercalation and Exfoliation of Carbon Fibers

One gram of P-25 fibers, ground to approximately 220 μm in sizes, was used as the anode material and 1 L of nitric acid was used as the electrolyte and intercalate source. The anode supporting element is a platinum plate and the cathode is a graphite plate of approximately 4 cm in diameter and 0.2 cm in thickness. The separator, a glass fiber fabric, was used to separate the cathode plate from the graphite flakes and to compress the graphite flakes down against the anode supporting element to ensure that the carbon fiber segments are in electrical contact with the anode supporting element to serve as the anode. The electrodes, electrolyte, and separator are contained in a Buchner-type funnel to form an electrochemical cell. The anode supporting element, the cathode, and the separator are porous to permit intercalate (electrolyte) to saturate the graphite and to pass through the cell from top to bottom.

The fiber segments were subjected to an electrolytic oxidation treatment at a current of 0.5 amps (current density of about 0.04 amps/cm$^2$) and at a cell voltage of about 4-6 volts for 2-5 hours. These values may be varied with changes in cell configuration and makeup. Following electrolytic treatment, the resulting intercalated fiber was washed with water and dried.

Subsequently, approximately ⅔ of the intercalated fiber sample was transferred to a furnace pre-set at a temperature of 600° C. for 30 seconds. The intercalated fiber was found to induce extremely rapid and high expansions of graphite crystallites. An ultrasonicator (operated with a power of 80 W) was used to further separate and down-size the platelets. The thickness of individual platelets were found to range from two graphene sheets to approximately 43 graphene sheets (average of 23 sheets or approximately 7.9 nm) based on SEM and TEM observations. The length-to-width ratio was approximately between 3 and 10.

EXAMPLE 4

Supercritical $CO_2$ Fluid Intercalation

One gram of PAN-based graphite fibers (Magnamite from Hercules) was placed in a tube furnace at a temperature of 800° C. in a nitrogen atmosphere for 3 hours to remove the surface finish of graphite fibers.

The treated graphite fiber sample was placed in a 100 milliliter high-pressure, single-compartment vessel with a heating provision. The vessel was capable of being isolated from the atmosphere by security clamps and ring. The vessel was in fluid communication with the high-pressure carbon dioxide by way of piping means and limited by valves. A heating jacket was disposed about the vessel to achieve and maintain the critical temperature of carbon dioxide.

When the vessel was isolated, the pressurized carbon dioxide was introduced therein and maintained at about 1,100 psig (pressure of 76 bars). Then, the vessel was heated to about 70° C. at which the supercritical conditions of carbon dioxide were achieved and maintained for about 3 hours to effect intercalation. Then, the vessel was immediately depressurized at a rate of about 3 milliliters per second, thus catastrophically lowering the pressure within the vessel. This was accomplished by opening a connected blow-off valve of the vessel. As a result, an exfoliated graphite fiber was formed.

After a mechanical shearing treatment in a laboratory-scale Cowles rotating blade device for 15 minutes, the resulting NGPs exhibit a thickness ranging from three graphene sheets to approximately 50 graphene sheets (average of 25 sheets or approximately 8.5 nm) based on SEM and TEM observations. The length-to-width ratio of NGPs was found to be between 12 and 34.

The above examples illustrate the notion that the NGPs with a high length-to-width aspect ratio can be advantageously incorporated in a matrix material to form a nanocomposite. Although a resin matrix was used in the examples, NGPs (like other reinforcements, such as carbon fibers) may be used as a reinforcement material for a wide range of matrix materials, including polymeric, carbonaceous, ceramic, glass, metallic, and organic. The methods that are used to prepare short fiber composites can be used to make NGP composites. Thus, the present invention also provides a nanocomposite material that contains NGPs with a high length-to-width aspect ratio. These nanocomposite exhibit several unique and desirable properties.

The invention claimed is:

1. A nano-scaled graphene platelet having a length, a width, and a thickness, wherein the thickness is no greater than 100 nm and the length-to-width ratio is no less than 3.

2. The nano-scaled graphene platelet of claim 1 wherein the length-to-width ratio is greater than 5.

3. The nano-scaled graphene platelet of claim 1 wherein the length-to-width ratio is greater than 10.

4. The nano-scaled graphene platelet of claim 1 wherein the thickness is thinner than 10 nm.

5. The nano-scaled graphene platelet of claim 1 wherein the thickness is thinner than 1 nm.

6. The nano-scaled graphene platelet of claim 1 wherein a length-to-thickness ratio is at least 10,000.

7. The nano-scaled graphene platelet of claim 1 wherein a length-to-thickness ratio is at least 30,000.

8. The nano-scaled graphene platelet of claim 1 which is prepared from a carbon fiber or graphite fiber.

9. The nano-scaled graphene platelet of claim 1 which is prepared by using a method comprising (a) intercalating a carbon fiber or graphite fiber with an intercalate to form an intercalated fiber; (b) exfoliating said intercalated fiber to obtain an exfoliated fiber comprising graphene sheets or flakes; and (c) separating said graphene sheets or flakes to obtain said nano-scaled graphene platelet.

10. The nano-scaled graphene platelet of claim 9 wherein said step of intercalating comprises chemical intercalating, electrochemical intercalating, gaseous phase intercalating, liquid phase intercalating, supercritical fluid intercalating, or a combination thereof.

11. The nano-scaled graphene platelet of claim 10 wherein said chemical intercalating comprises exposing said carbon fiber or graphite fiber to a chemical selected from sulfuric acid, sulfonic acid, nitric acid, a carboxylic acid, a metal chloride solution, a metal-halogen compound, halogen liquid or vapor, potassium permanganate, alkali nitrate, alkali perchlorate, an oxidizing agent, or a combination thereof.

12. The nano-scaled graphene platelet of claim 11 wherein said carboxylic acid is selected from the group consisting of aromatic carboxylic acid, aliphatic or cycloaliphatic carboxylic acid, straight chain or branched chain carboxylic acid, saturated and unsaturated monocarboxylic acids, dicarboxylic acids and polycarboxylic acids that have 1-10 carbon atoms, alkyl esters thereof, and combinations thereof.

13. The nano-scaled graphene platelet of claim 11 wherein said metal-halogen compound or halogen liquid or vapor comprises a molecule selected from bromine ($Br_2$), iodine ($I_2$), iodine chloride (ICl), iodine bromide (IBr), bromine chloride (BrCl), iodine pentafluoride ($IF_5$), bromine trifluoride ($BrF_3$), chlorine trifluoride ($ClF_3$), phosphorus trichloride ($PCl_3$), phosphorus tetrachloride ($P_2Cl_4$), phosphorus tribromide ($PBr_3$), phosphorus triiodide ($PI_3$), or a combination thereof.

14. The nano-scaled graphene platelet of claim 10 wherein said electrochemical intercalating comprises using a carboxylic acid as both an electrolyte and an intercalate source.

15. The nano-scaled graphene platelet of claim 10 wherein said electrochemical intercalating comprises imposing a current, at a current density in the range of 50 to 600 $A/m^2$, to said carbon fiber or graphite fiber which is used as an electrode material.

16. The nano-scaled graphene platelet of claim 9 wherein said step of exfoliating said intercalated fiber comprises exposing said intercalated fiber to a temperature in the range of 150° C. to 1,100° C.

17. The nano-scaled graphene platelet of claim 9 wherein said step of intercalating comprises using an acid as an intercalate and said step of exfoliating said intercalated fiber comprises exposing said intercalated fiber to a temperature in the range of 600° C. to 1,100° C.

18. The nano-scaled graphene platelet of claim 1 which is prepared by using a method comprising (a) intercalating a carbon fiber or graphite fiber with an intercalate to form an intercalated fiber; and (b) exfoliating said intercalated fiber to obtain said graphene platelet.

19. A nanocomposite material comprising a nano-scaled graphene platelet of claim 1 dispersed in a matrix material wherein said matrix material has a weight fraction between 1% and 99% of the nanocomposite.

20. A nanocomposite of claim 19 wherein said matrix material is selected from a polymer, glass, ceramic, carbon, metal, organic, or a combination thereof.

* * * * *